(12) United States Patent
Saegusa et al.

(10) Patent No.: US 10,734,955 B2
(45) Date of Patent: Aug. 4, 2020

(54) AUDIO AMPLIFIER, AUDIO OUTPUT DEVICE INCLUDING THE SAME, AND ELECTRONIC APPARATUS

(71) Applicant: ROHM CO., LTD., Kyoto (JP)

(72) Inventors: Yuji Saegusa, Kyoto (JP); Keita Okamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/361,523

(22) Filed: Mar. 22, 2019

(65) Prior Publication Data

US 2019/0305737 A1    Oct. 3, 2019

(30) Foreign Application Priority Data

Mar. 30, 2018  (JP) ................. 2018-068825

(51) Int. Cl.
| | |
|---|---|
| H03F 3/45 | (2006.01) |
| H03F 3/68 | (2006.01) |
| H03F 1/52 | (2006.01) |
| H04R 3/04 | (2006.01) |

(52) U.S. Cl.
CPC ......... *H03F 3/45089* (2013.01); *H03F 1/523* (2013.01); *H03F 3/68* (2013.01); *H04R 3/04* (2013.01); *H03F 2200/03* (2013.01); *H03F 2200/426* (2013.01); *H03F 2203/45374* (2013.01)

(58) Field of Classification Search
CPC .... H03F 3/45089; H03F 3/68; H03F 2200/03; H03F 2200/426; H03F 2203/45374; H04R 3/04; H04R 2201/28; H04R 2420/05; H04R 2420/03; H04R 5/04; H03G 3/34; H03G 3/32
USPC ................. 381/120, 77, 79, 80–81
See application file for complete search history.

(56) References Cited

U.S. PATENT DOCUMENTS

| | | | |
|---|---|---|---|
| 9,036,835 B2 * | 5/2015 | Buuck ............ | H03F 3/217 330/10 |
| 2011/0216920 A1 * | 9/2011 | Yamamoto ......... | 381/120 |
| 2013/0195289 A1 * | 8/2013 | Yamauchi ......... | H03F 1/523 381/120 |

FOREIGN PATENT DOCUMENTS

| | | |
|---|---|---|
| JP | 2011182263 A | 9/2011 |
| JP | 2017112428 A | 6/2017 |

* cited by examiner

*Primary Examiner* — Disler Paul
(74) *Attorney, Agent, or Firm* — Cantor Colburn LLP (57) ABSTRACT

An audio amplifier of a BTL (Bridged Tied Load) type, includes a first amplifier, a second amplifier, a first output pin connected to an output of the first amplifier, a second output pin connected to an output of the second amplifier, a first monitor pin, a second monitor pin, a current source connected to the first monitor pin and configured to be switched on and off, a switch interposed between the second monitor pin and a fixed voltage line, and a load state determination circuit configured to detect a state of a load based on a potential difference between the first monitor pin and the second monitor pin.

10 Claims, 12 Drawing Sheets

AUDIO AMPLIFIER, AUDIO OUTPUT DEVICE INCLUDING THE SAME, AND ELECTRONIC APPARATUS

CROSS-REFERENCE TO RELATED APPLICATION

The present application claims priority under 35 U.S.C. § 119 to Japanese Patent Application No. 2018-068825, filed on Mar. 30, 2018, the entire contents of which are incorporated herein by reference.

TECHNICAL FIELD

The present disclosure relates to an amplifier for driving a speaker or a headphone.

BACKGROUND

Figure 1:
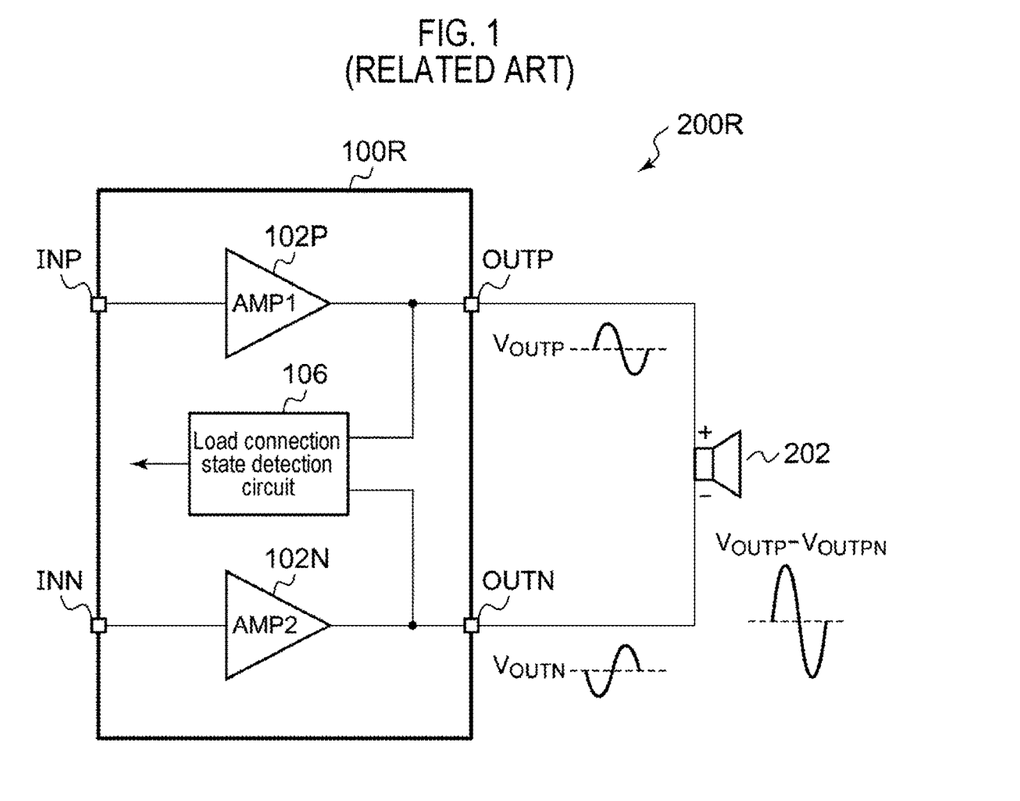
FIG. 1 is a circuit diagram of an audio output device including an audio amplifier of a BTL (Bridged Tied Load) type.

An audio amplifier (also referred to as a power amplifier) is used to amplify an audio signal to drive an electroacoustic transducer such as a speaker or a headphone. FIG. 1 is a circuit diagram of an audio output device 200R including an audio amplifier 100R of a BTL (Bridged Tied Load) type. The positive electrode terminal (+) and the negative electrode terminal (−) of an electroacoustic transducer 202, which is a load, are connected to the output terminals OUTP and OUTN of the audio amplifier 100R, respectively. The audio amplifier 100R includes a first amplifier 102P that outputs a drive voltage $V_{OUTP}$, and a second amplifier 102N that outputs a drive voltage $V_{OUTN}$ having a phase reverse to the phase of the drive voltage $V_{OUTP}$.

The audio amplifier 100R further includes a load connection state detection circuit 106 for detecting abnormality such as an open state of the electroacoustic transducer 202. For example, a conventional load connection state detection circuit may cause a current to flow into one output terminal to detect one of a normal state, an open state, and a short state in accordance with a voltage or current appearing at the one output terminal.

The present inventors have reviewed the audio amplifier 100R of FIG. 1 and recognized the following problems.

In the application circuit of FIG. 1, the two output terminals OUTP and OUTN are directly connected to the terminals + and − of the electroacoustic transducer 202, respectively. However, in some different application circuits, a DC blocking capacitor may be interposed between the output terminal OUTP and the terminal + of the electroacoustic transducer 202 or between the output terminal OUTN and the terminal − of the electroacoustic transducer 202. In the related art, in such cases, the connection state of a load cannot be determined correctly.

In addition, in the related art, open/short criteria are defined as parameters inside the audio amplifier 100R and cannot be set by a designer of an audio output device such as the audio output device 200R.

SUMMARY

Some embodiments of the present disclosure provide an audio amplifier capable of detecting abnormality in various application circuits and setting criteria on abnormality.

According to one embodiment of the present disclosure, there is provided an audio amplifier of a BTL (Bridged Tied Load) type, including a first amplifier, a second amplifier, a first output pin connected to an output of the first amplifier, a second output pin connected to an output of the second amplifier, a first monitor pin, a second monitor pin, a current source connected to the first monitor pin and configured to be switched on and off, a switch interposed between the second monitor pin and a fixed voltage line, and a load state determination circuit configured to detect a state of a load based on a potential difference between the first monitor pin and the second monitor pin.

DETAILED DESCRIPTION (Outline of Embodiments)

Embodiments disclosed in the present disclosure relate to an audio amplifier of a BTL type. The audio amplifier includes a first amplifier, a second amplifier, a first output pin connected to an output of the first amplifier, a second output pin connected to an output of the second amplifier, a first monitor pin, a second monitor pin, a current source connected to the first monitor pin and configured to be switched on/off, a switch interposed between the second monitor pin and a fixed voltage line; and a load state determination circuit configured to detect the state of a load based on a potential difference between the first monitor pin and the second monitor pin.

The load state determination circuit may detect an open state of the load based on a result of comparison between the potential difference and a predetermined threshold voltage. When the electroacoustic transducer as the load is normal, the impedance $R_L$ is in a range of several Ω (2 to 32Ω), and when the load is open, the impedance $R_L$ is larger than several hundred Ω. When the output current of the current source is denoted by $I_{TEST}$, a potential difference ($I_{TEST} \times R_L$) occurs between the first monitor pin and the second monitor pin. By comparing the potential difference with the threshold value $V_{OPEN}$, the open state of the load can be detected.

In addition, assuming that an external resistor is interposed between the first monitor pin and one end of the load and/or between the second monitor pin and the other end of the load, when the external resistance value is denoted by $R_{EXT}$, a potential difference $\{I_{TEST} \times (R_L + R_{EXT})\}$ occurs between the first monitor pin and the second monitor pin. By comparing the potential difference with the threshold value $V_{OPEN}$, the open state of the load can be detected, and the criteria for open detection can be set according to the external resistance $R_{EXT}$.

The output of the current source may be on the order of tens of μA, that is, 100 μA or less. Due to this feature, it is possible to prevent occurrence of a noise from the load when determining the state of the load.

The load state determination circuit may include a voltage comparator, to which a voltage of each of the first monitor pin and the second monitor pin is input. The voltage comparator has an input offset voltage corresponding to the threshold voltage. Due to this feature, it is possible to compare the potential difference between the two monitor pins with a small threshold value.

The audio amplifier may further include an enable pin to which an enable signal for instructing open detection is input. The current source may be turned on when the enable signal instructs the open detection.

The audio amplifier may further include a shutdown pin to which a shutdown signal indicative of a shutdown state or release of the shutdown state is input. When the shutdown signal is indicative of the shutdown state and the enable signal instructs the open detection, the load state determination circuit may be enabled.

The audio amplifier may further include an abnormality detection circuit configured to detect an abnormality of the audio amplifier, a diagnosis pin configured to notify the presence or absence of an abnormality to the outside (e.g., outside of the audio amplifier), and an output part configured to change the state of the diagnosis pin according to the outputs of the abnormality detection circuit and the load state determination circuit. The abnormality detection circuit may be invalidated in a state when the load state determination circuit is enabled.

The switch may also serve as a transistor for surge protection.

The current source may smoothly increase the output current with time. Due to this feature, it is possible to prevent a noise from being generated from the electroacoustic transducer.

The audio amplifier may be integrated on a single semiconductor substrate. As used herein, the term "integrated" is intended to include both a case where all elements of a circuit are formed on a semiconductor substrate and a case where main elements of the circuit are integrated on the semiconductor substrate. In addition, some resistors, capacitors, and the like for adjustment of a circuit constant may be provided outside the semiconductor substrate. By integrating the circuits on one chip, the circuit area can be reduced and the characteristics of the circuit elements can be kept uniform.

(Embodiments)

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not affect an electrical connection state between the members A and C or the members B and C or does not impair function and effects achieved by combinations of the members A and C or the members B and C, in addition to a case where the member A and the member C or the member B and the member C are directly connected.

The vertical axis and the horizontal axis of the waveform chart and the timing chart referred to in the present disclosure are enlarged and reduced appropriately for easy understanding, and each waveform shown is also simplified, exaggerated, or emphasized for easy understanding.

Figure 2:
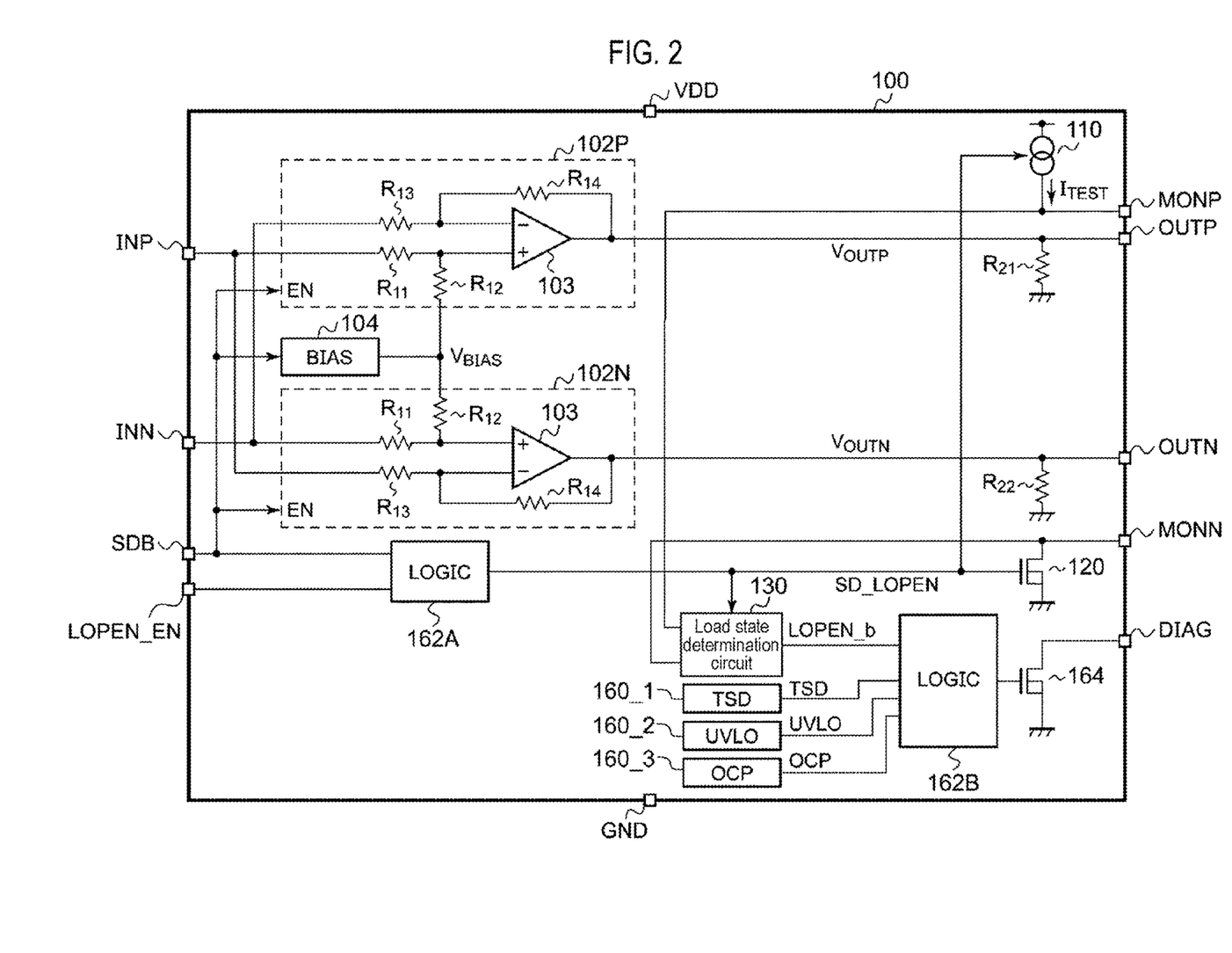
FIG. 2 is a circuit diagram of an audio amplifier according to an embodiment.

FIG. 2 is a circuit diagram of an audio amplifier 100 according to an embodiment. The audio amplifier 100 is a full-differential type BTL amplifier, which is an IC (Integrated Circuit) integrated on a single semiconductor substrate (die) and accommodated in a package. A differential input audio signal is received at a first input pin INP and a second input pin INN and a reverse phase differential audio signal is output from a first output pin OUTP and a second output pin OUTN.

The output of a first amplifier 102P is connected to the first output pin OUTP, and the output of a second amplifier 102N is connected to the second output pin OUTN. The first amplifier 102P and the second amplifier 102N each include resistors $R_{11}$ to $R_{14}$ and an operational amplifier 103 and have the same configuration.

A shutdown (SDB) signal is input to a shutdown (SDB) pin. The audio amplifier 100 is in a shutdown state (also referred to as a standby state) when the SDB signal is at a first level (e.g., a low level). When the SDB signal changes to a second level (e.g., a high level), the shutdown state is released. The first amplifier 102P and the second amplifier 102N are disabled in the shutdown state and their outputs have high impedance. Pull-down resistors $R_{21}$ and $R_{22}$ are interposed between the output of the first amplifier 102P and the ground and between the output of the second amplifier 102N and the ground, respectively. In the disabled state of the first amplifier 102P and the second amplifier 102N, the OUTP pin and the OUTN pin are pulled down to the ground voltage. When the shutdown state is released, the first amplifier 102P and the second amplifier 102N change to an enabled state and output the output signals $V_{OUTP}$ and $V_{OUTN}$ according to an input signal.

A bias circuit 104 generates a bias voltage $V_{BIAS}$ and supplies it to the first amplifier 102P and the second amplifier 102N. The SDB signal is also input to the bias circuit 104. When the SDB signal has the high level and the shutdown state is released, the bias circuit 104 smoothly increases the bias voltage $V_{BIAS}$ with time. This allows the output voltages $V_{OUTP}$ and $V_{OUTN}$ to smoothly rise after the shutdown state is released, thereby preventing a noise from being generated from a load (electroacoustic transducer) connected to the first output pin OUTP and the second output pin OUTN.

The audio amplifier 100 has a function of determining the state of the load. In the present embodiment, the audio amplifier 100 can detect an open state of the load. To this end, the audio amplifier 100 is provided with a first monitor pin MONP, a second monitor pin MONN, a current source 110, a switch 120, a load state determination circuit 130, and a load open enable (LOPEN_EN) pin.

The current source 110 is connected to the MONP pin and is configured to be switched between turn-on and turn-off. The current source 110 is turned on during a period of determining the state of the load and outputs a constant current (also referred to as a test current) $I_{TEST}$ on the order of tens of μA. The switch 120 is interposed between the second monitor pin MONN and a fixed voltage line (ground line in the present embodiment). The switch 120 is turned on during the determination period. This switch 120 is designed to also serve as a transistor for surge protection.

The load state determination circuit 130 determines the state of an electroacoustic transducer, which is a load, according to a potential difference $\Delta V$ between the MONP pin and the MONN pin.

More specifically, the load state determination circuit 130 detects an open state of the load based on a result of comparison between the potential difference $\Delta V$ and a predetermined threshold voltage $V_{OPEN}$. That is, the open abnormality is determined when $\Delta V = V_P - V_N > V_{OPEN}$, and the normality is determined when $\Delta V = V_P - V_N < V_{OPEN}$. An open detection signal LOPEN_b, which corresponds to an output of the load state determination circuit 130, is asserted (low) when the load is open, and is negated (high) when the load is normal. In the present disclosure, "_b" appended to the end of a signal denotes logic inversion.

For example, assume that $I_{TEST}$=25 μA and the resistance value $R_L$ (in normal state) of the electroacoustic transducer 202 is 8Ω. When the electroacoustic transducer 202 is normal, the potential difference $\Delta V$=25 μA×8Ω=0.2 mV. When the resistance value $R_L$ of the electroacoustic transducer 202 is larger than $R_{OPEN}$ and the open abnormality is determined, the threshold voltage $V_{OPEN}=I_{TEST} \times R_{OPEN}$. For example, when $R_{OPEN}$=800Ω, $V_{OPEN}$=25 μA×800Ω=20 mV.

An enable (LOPEN_EN) signal is input to the LOPEN_EN pin from the outside. When the LOPEN_EN signal is at the first level (e.g., a high level), a determination period for the load state starts. A logic circuit 162A asserts its output signal SD_LOPEN (high) when the LOPEN_EN signal indicates the determination period (high) and the SDB signal indicates the shutdown state (low). While the SD_LOPEN signal is asserted, the determination of the actual load state is made. The current source 110 is turned on when the SD_LOPEN signal is at a high level, and the switch 120 is also turned on when the SD_LOPEN signal is at the high level.

The audio amplifier 100 further includes a plurality of abnormality detection circuits 160. An abnormality detection circuit 160_1 is a thermal shutdown (TSD) circuit, which monitors the temperature of the chip of the audio amplifier 100 and asserts (high) a TSD signal in overheat abnormality. An abnormality detection circuit 160_2 is an undervoltage lockout (UVLO) circuit, which monitors a power supply voltage $V_{DD}$ and asserts a UVLO signal upon detecting a state where the power supply voltage $V_{DD}$ is reduced. An abnormality detection circuit 160_3 is an overcurrent protection (OCP) circuit, which asserts (high) an OCP signal upon detecting an overcurrent state of the output current of each of the first amplifier 102P and the second amplifier 102N. The abnormality detection circuits 160_1 to 160_3 are invalidated during a valid period of the load state determination circuit 130, that is, during the period when the LOPEN_EN signal is at the high level.

A logic circuit 162B receives the LOPEN_b signal, the TSD signal, the UVLO signal, and the OCP signal, turns on an output transistor 164 when any one of the signals indicates abnormality, and pulls down a DIAG pin to a low level.

Figure 3:
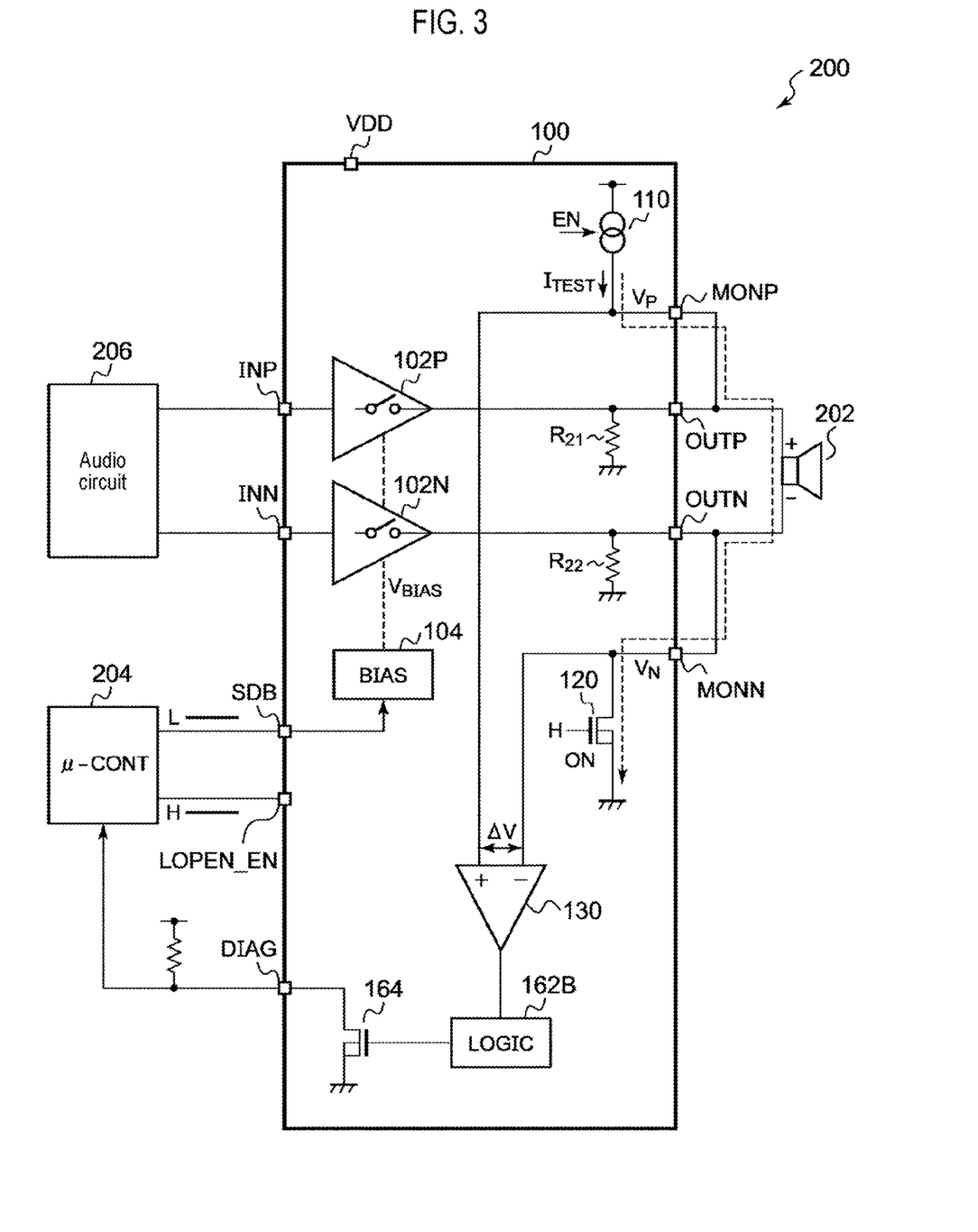
FIG. 3 is an equivalent circuit diagram of the audio amplifier when a load state is determined.

The above is the configuration of the audio amplifier 100. Subsequently, the operation thereof will be described. FIG. 3 is an equivalent circuit diagram of the audio amplifier 100 when a load state is determined. In this application circuit, the positive electrode terminal (+) of the electroacoustic transducer 202 is connected to the OUTP terminal and the MONP terminal, and its negative electrode terminal (−) is connected to the OUTN terminal and the MONN terminal. Further, a microcontroller 204 for integrally controlling an audio output device 200 is connected. The microcontroller 204 generates the SDB signal and the LOPEN_EN signal. The microcontroller 204 also monitors the state of the DIAG pin.

After the power supply voltage $V_{DD}$ is input, in a state where a low level signal is provided to the SDB pin, when a high level signal is provided to the LOPEN_EN pin, the load state is determined as valid, the current source 110 is turned on, and the switch 120 is turned on. As a result, the test current $I_{TEST}$ flows from the current source 110 via the MONP pin, the electroacoustic transducer 202, the MONN pin, and the switch 120.

Assuming that the impedance of the electroacoustic transducer 202 is $R_L$, when $R_L \ll R_{21}$ and $R_{22}$, the test current $I_{TEST}$ flows into the electroacoustic transducer 202, and the potential difference $\Delta V = V_P - V_N$ between the MONP pin and the MONN pin at that time is given by the following equation (1).

$$\Delta V = R_L \times I_{TEST} \qquad (1)$$

When the electroacoustic transducer 202 is normal, since $\Delta V < V_{OPEN}$, the LOPEN_b signal has a high level, the output transistor 164 is turned off, and the DIAG pin is pulled up to a high level by an external resistor. When the electroacoustic transducer 202 is open, since $\Delta V > V_{OPEN}$, the LOPEN_b signal goes to a low level, the output transistor 164 is turned on, and the DIAG pin goes to a low level.

According to the audio amplifier 100, it is possible to detect open abnormality of the electroacoustic transducer 202.

Figure 4:
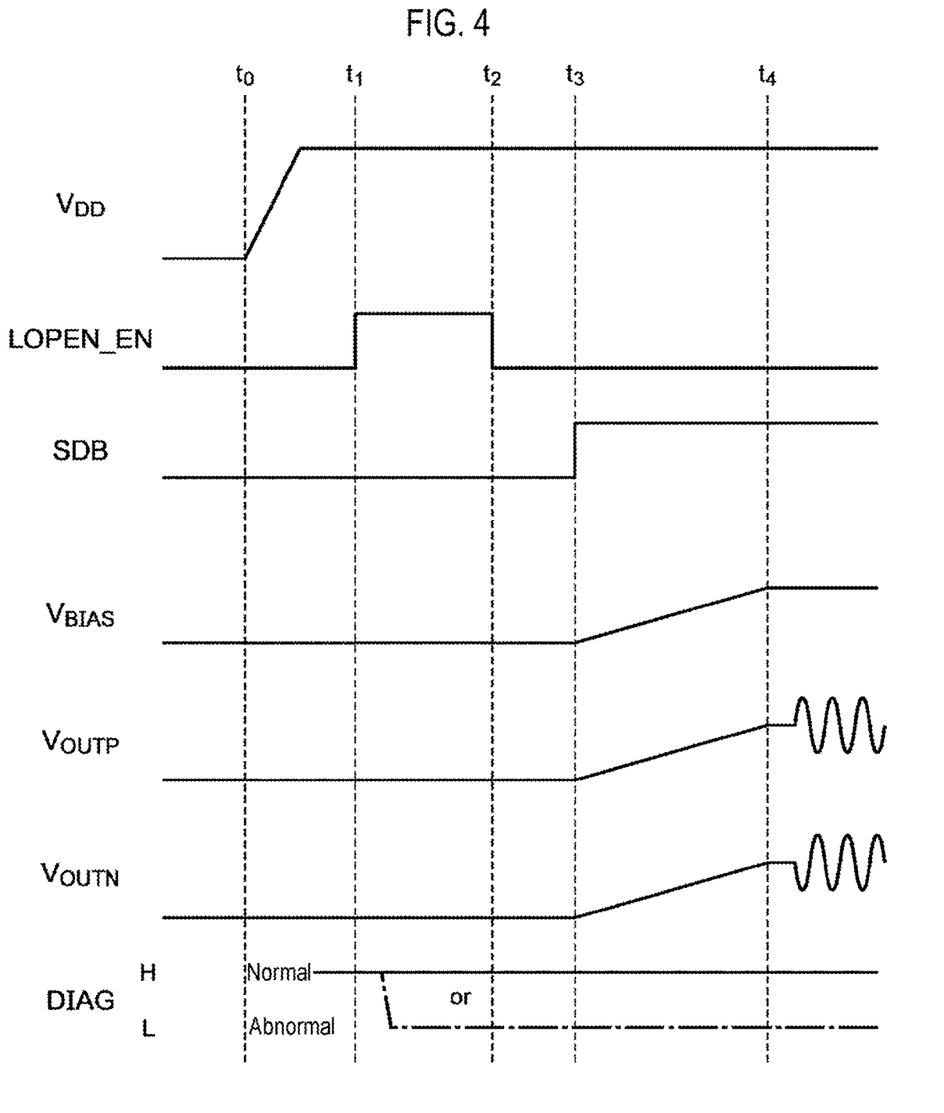
FIG. 4 is a timing chart at the time of activation of the audio amplifier.

FIG. 4 is a timing chart at the time of activation of the audio amplifier 100. The power supply voltage $V_{DD}$ rises at time $t_0$. Subsequently, at time $t_1$, the LOPEN_EN signal has a high level, and the above-described open abnormality determination is performed. As a result, when the open abnormality is detected, the DIAG signal goes to a low level as indicated by a dash-dot line, and the activation sequence is interrupted.

During the determination period from time $t_1$ to time $t_2$, when the open abnormality is not detected, the DIAG signal remains at the high level. At time $t_3$, when the SDB signal goes to a high level and the shutdown state is released, the bias voltage $V_{BIAS}$ rises and the output voltages $V_{OUTP}$ and $V_{OUTN}$ also rise. When an audio signal is input from the audio circuit 206 to the INP pin and the INN pin after completion of the activation (after time $t_4$), the differential audio signals $V_{OUTP}$ and $V_{OUTN}$ are supplied to the electroacoustic transducer 202.

During the determination period from time $t_1$ to $t_2$, all the other abnormality detection circuits 160_1 to 160_N excluding the load state determination circuit 130 are in an invalid state. Therefore, when the DIAG signal goes to the low level in the period during which the LPEN_EN signal has the high level, the microcontroller 204 can specify that the abnormality is an open state of the load. That is, the audio amplifier 100 can distinguish the open state of the load from other abnormalities with one DIAG pin.

Figure 5:
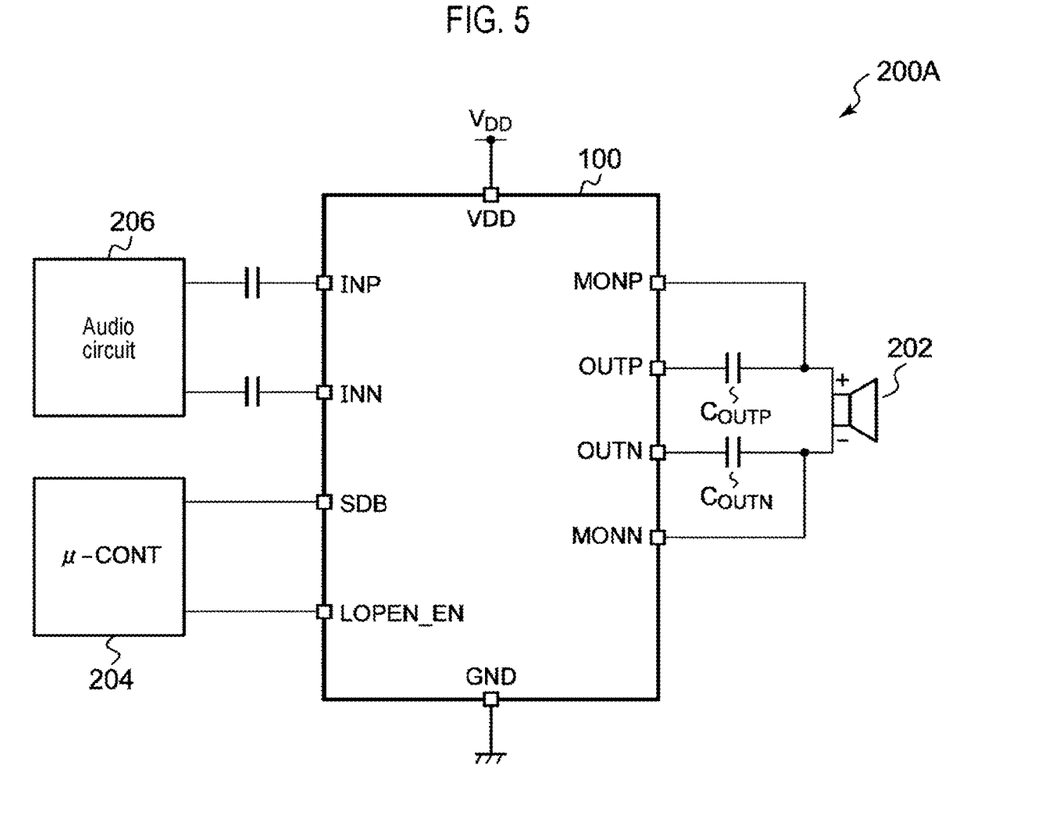
FIG. 5 is a block diagram of an audio output device according to another application.
Figure 6:
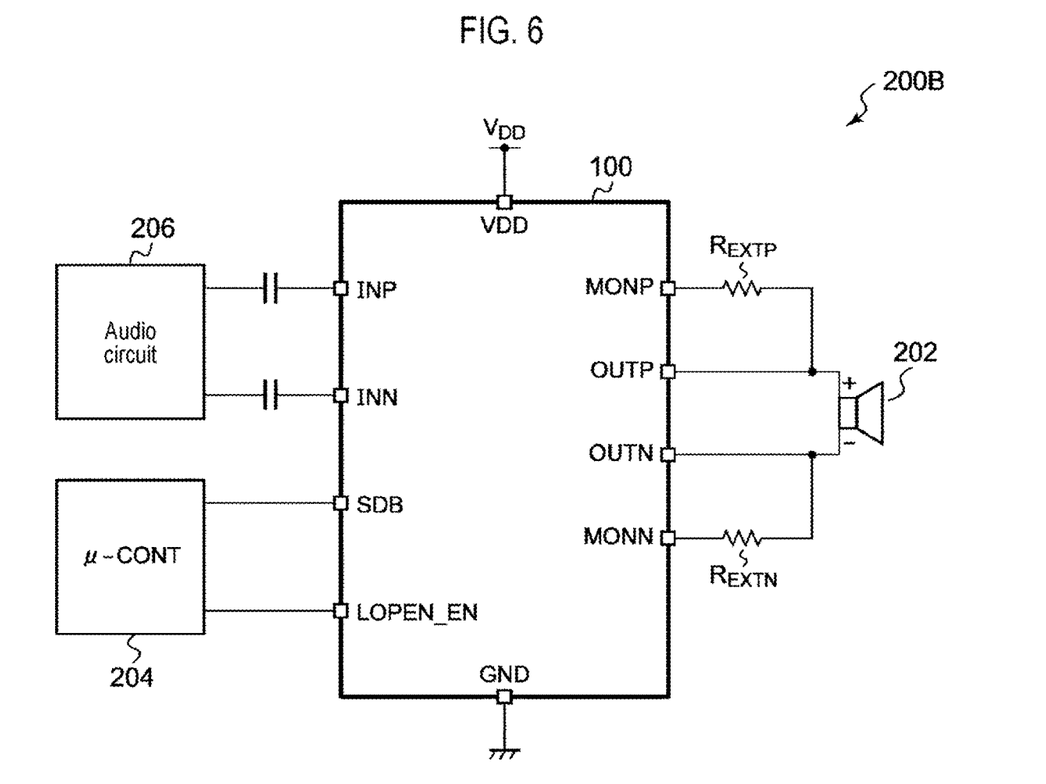
FIG. 6 is a block diagram of an audio output device according to another application.

Further advantages of the audio amplifier 100 are clarified by applications of FIG. 5 and FIG. 6.

FIG. 5 is a block diagram of an audio output device 200A according to another application. In this application, DC block capacitors $C_{OUTP}$ and $C_{OUTN}$ are interposed between the positive electrode terminal (+) of the electroacoustic transducer 202 and the OUTP pin and between the negative electrode terminal (−) of the electroacoustic transducer 202 and the OUTN pin, respectively. The MONP pin is connected to the positive electrode pin (+) of the electroacoustic transducer 202, and the MONN pin is connected to the negative electrode pin (−) of the electroacoustic transducer 202. In the load determination, the test current $I_{TEST}$ is sourced from the MONP pin and is sunk from the MONN pin via the electroacoustic transducer 202. Therefore, it is possible to determine the state of the electroacoustic transducer 202 by using the DC test current $I_{TEST}$ without being affected by the capacitors $C_{OUTP}$ and $C_{OUTN}$.

FIG. 6 is a block diagram of an audio output device 200B according to another application. In this application, a resistor $R_{EXTP}$ is interposed between the MONP pin and the positive electrode terminal (+) of the electroacoustic transducer 202, and a resistor $R_{EXTN}$ is interposed between the MONN pin and the negative electrode terminal (−) of the electroacoustic transducer 202.

In the load determination, the test current $I_{TEST}$ is sourced from the MONP pin and is sunk from the MONN pin via the resistor $R_{EXTP}$, the electroacoustic transducer 202, and the resistor $R_{EXTN}$. A potential difference between the MONP pin and the MONN pin is given by the following equation (2).

$$\Delta V = I_{TEST} \times (R_{EXTP} + R_{EXTN} + R_L) \quad (2)$$

Since the load is determined to be open when $\Delta V > V_{OPEN}$, the following equation (3) is the condition for open determination.

$$I_{TEST} \times R_L > V_{OPEN} - I_{TEST} \times (R_{EXTP} + R_{EXTN}) \quad (3)$$

That is, it is possible to set a threshold value for open determination from the outside according to the external resistors $R_{EXTP}$ and $R_{EXTN}$.

In FIG. 6, one of the resistors $R_{EXTP}$ and $R_{EXTN}$ may be omitted. Alternatively, a diode may be inserted in place of the resistors $R_{EXTP}$ and $R_{EXTN}$ or in series with the resistors $R_{EXTP}$ and $R_{EXTN}$. In this case, the open determination threshold value can be shifted according to the forward voltage $V_F$ of the diode.

Figure 7:
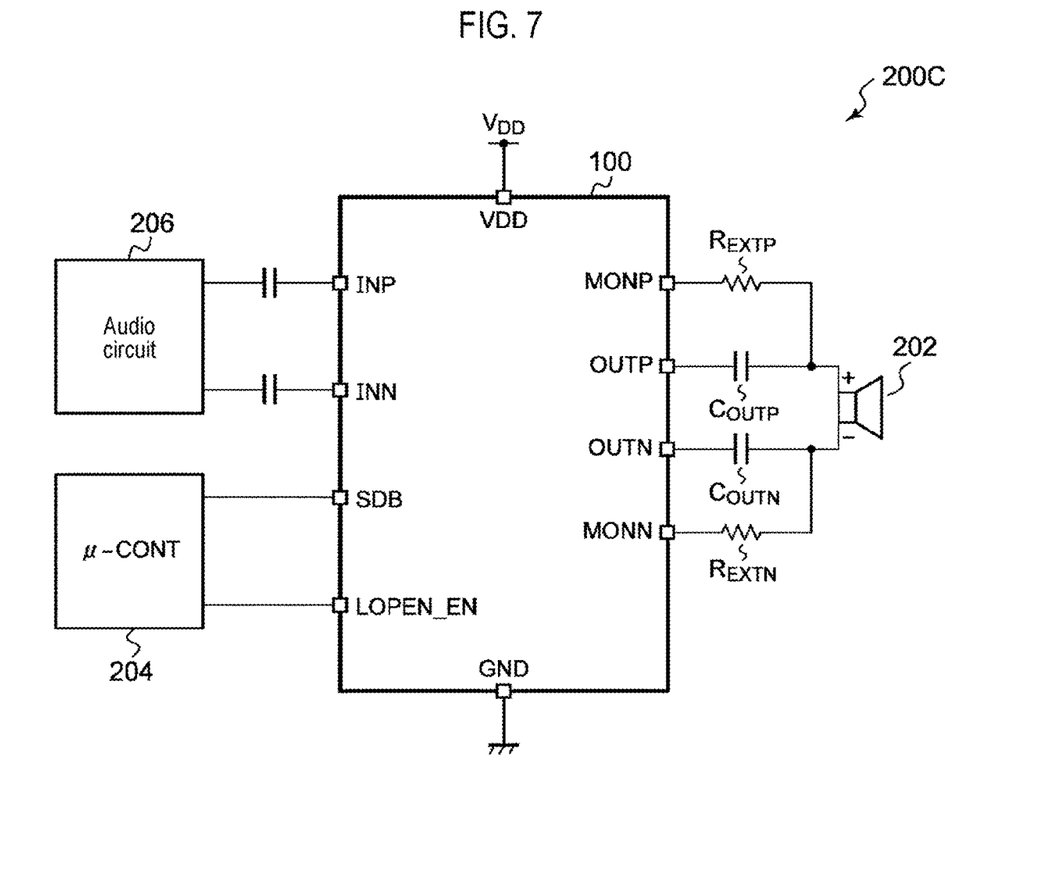
FIG. 7 is a block diagram of an audio output device according to another application.

FIG. 7 is a block diagram of an audio output device 200C according to another application. This audio output device 200C is a combination of FIG. 4 and FIG. 5.

The present disclosure may be understood as the block diagram/circuit diagram of FIG. 2 or covers various devices and circuits derived from the above description. However, the present disclosure is not limited to the disclosed particular configurations, Hereinafter, more specific examples and modifications will be described in order to aid the understanding of the nature and circuit operation of the present disclosure and clarify them, rather than to narrow the scope of the present disclosure.

Figure 8:
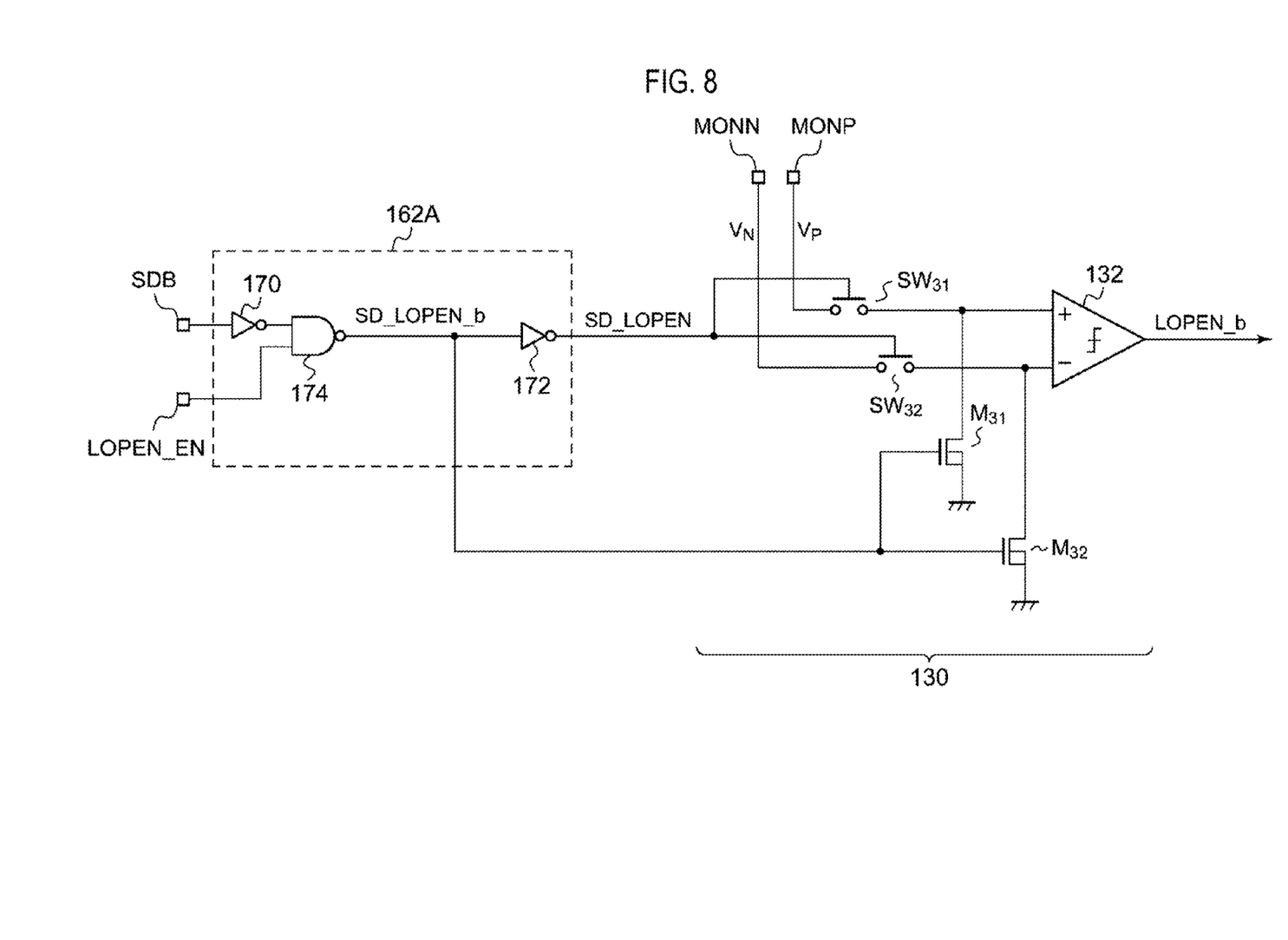
FIG. 8 is a view showing a configuration example of a load state determination circuit.

FIG. 8 shows a configuration example of the load state determination circuit 130. The load state determination circuit 130 includes a voltage comparator 132. The voltage $V_P$ of the MONP pin is input to the non-inverting input terminal (+) of the voltage comparator 132, and the voltage $V_N$ of the MONN pin is input to the inverting input terminal (−) thereof. The voltage comparator 132 is designed to have an input offset voltage $V_{OFS}$ corresponding to a threshold voltage $V_{OPEN}$ (20 mV). The output LOPEN_b of the voltage comparator 132 has a low level when $V_P - V_{OFS} > V_N$, and has a high level when $V_P - V_{OFS} < V_N$.

The load state determination circuit 130 further includes input switches $SW_{31}$ and $SW_{32}$ and transistors $M_{31}$ and $M_{32}$. When the load determination is instructed (that is, the SD_LOPEN signal has a high level and the SD_LOPEN_b signal has a low level), the input switches $SW_{31}$ and $SW_{32}$ are turned on and the transistors $M_{31}$ and $M_{32}$ are turned off. Otherwise (that is, the SD_LOPEN signal has a low level and the SD_LOPEN_b signal has a high level), the input switches $SW_{31}$ and $SW_{32}$ are turned off and the transistors $M_{31}$ and $M_{32}$ are turned on.

The configuration of the logic circuit 162A includes, for example, but is not limited to, inverters 170, 172, and a NAND gate 174.

Figure 9:
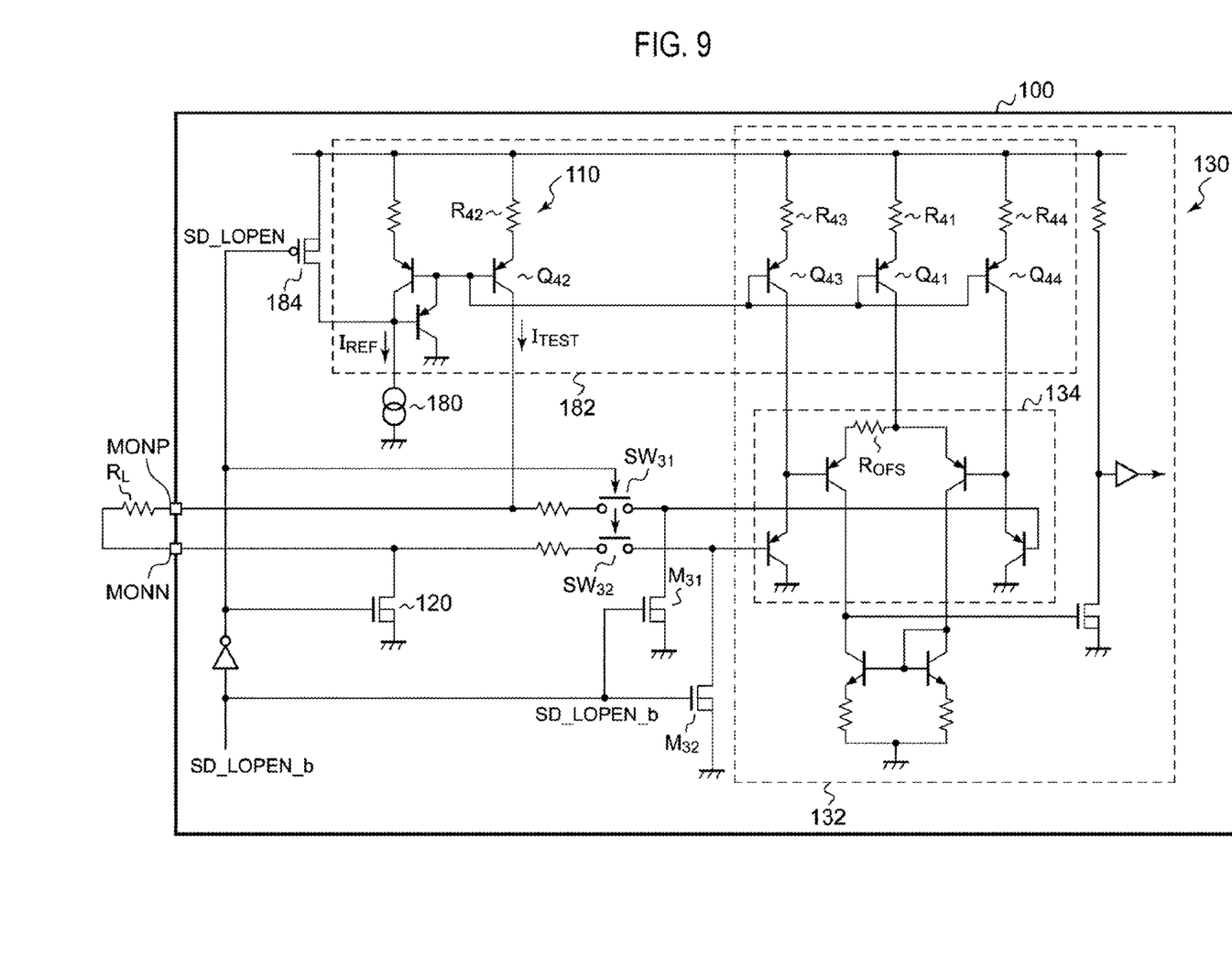
FIG. 9 is a circuit diagram of a configuration example of a part of an audio amplifier.

FIG. 9 is a circuit diagram of a configuration example of a part of the audio amplifier 100. As described above, the voltages $V_P$ and $V_N$ input to the voltage comparator 132 are both voltages near 0V. Therefore, the voltage comparator 132 includes a Darlington PNP differential input pair 134. A resistor $R_{OFS}$ for introducing an offset voltage $V_{OFS}$ is connected to one differential input in the differential input pair 134. A method of introducing an offset in the voltage comparator is not limited thereto but may be one of other known methods.

The current source 110 is a part of a current mirror circuit 182 that copies a reference current $I_{REF}$ generated by a reference current source 180. The reference current $I_{REF}$ generated by the reference current source 180 is copied by the current mirror circuit 182 and is also used as a tail current or a bias current of the voltage comparator 132. A transistor 184 is connected to the current mirror circuit 182. The transistor 184 is turned on when the SD_LOPEN signal has a low level, that is, in a period other than the load determination period, to stop the reference current source 180 and the current mirror circuit 182 and eventually to shut down the current source 110 and the voltage comparator 132.

Among transistors constituting the current mirror circuit 182, transistors $Q_{41}$ and $Q_{42}$ may be laid out as a pair and transistors $Q_{43}$ and $Q_{44}$ may be laid out as a pair. In the same manner for resistors, resistors $R_{41}$ and $R_{42}$ may be laid out as a pair and resistors $R_{43}$ and $R_{44}$ may be laid out as a pair.

The present disclosure has been described above by way of embodiments. The disclosed embodiments are illustrative only and it should be understood by those skilled in the art that various modifications to combinations of elements or processes may be made and such modifications fall within the scope of the present disclosure. Such modifications will be described below.

(First Modification)

Figure 10A:
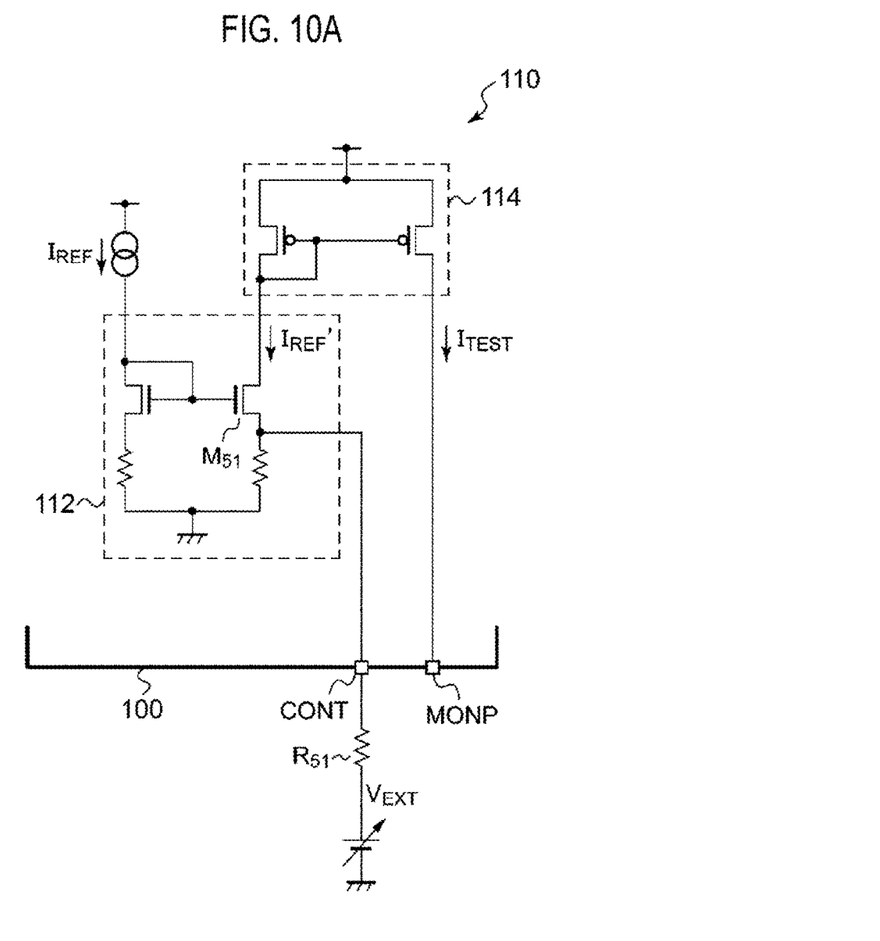
FIG. 10A and FIG. 10B are circuit diagrams showing modifications of a current source.

FIG. 10A and FIG. 10B are circuit diagrams showing modifications of the current source 110. The current source 110 of FIG. 10A is configured so as to set the current amount of the test current $I_{TEST}$ according to a voltage level of a control signal $V_{EXT}$ from the outside. The current source 110 includes a first current mirror circuit 112 and a second current mirror circuit 114. The first current mirror circuit 112 loops back the reference current $I_{REF}$. The second current mirror circuit 114 further loops back the output current $I_{REF}'$ of the first current mirror circuit 112 and outputs the test current $I_{TEST}$. The audio amplifier 100 is provided with a control (CONT) pin. The source (or emitter) of a transistor $M_{51}$ on the output side of the first current mirror circuit 112 is connected to the CONT pin. When nothing is connected to the CONT pin, the first current mirror circuit 112 copies the reference current $I_{REF}$ as it is. The control voltage $V_{EXT}$ can be externally applied to the CONT pin via a resistor $R_{51}$. When the control voltage $V_{EXT}$ is applied, the output current $I_{REF}'$ of the first current mirror circuit 112 can be adjusted according to the control voltage $V_{EXT}$.

Figure 10B:
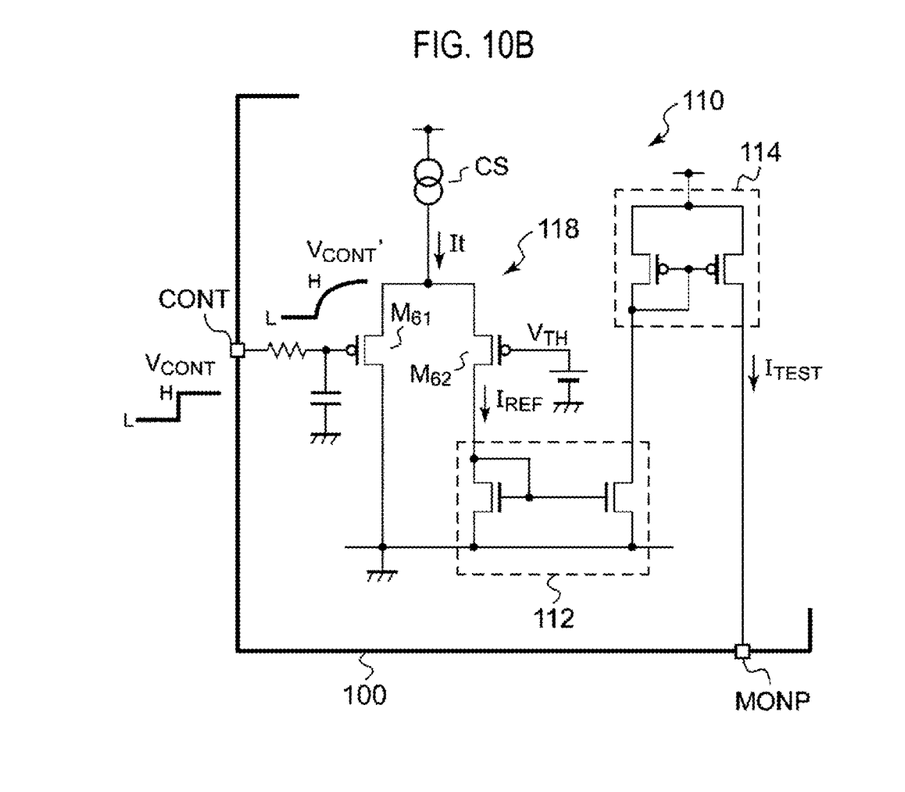

Referring to FIG. 10B, this current source 110 smoothly increases the test current $I_{TEST}$ with time. A control signal $V_{CONT}$ is externally input to a control pin CONT. The control signal $V_{CONT}$ passes through a low pass filter 116 and is input to a differential amplifier 118. After passing through the low pass filter 116, the control signal $V_{CONT}$ smoothly rises with time. When a control signal $V_{CONT}'$ is in a low state, since $V_{CONT}' \ll V_{TH}$, almost all of a tail current It flows to the transistor $M_{61}$ side, and the current $I_{REF}$ flowing through a transistor $M_{62}$ is zero. When the control signal $V_{CONT}'$ rises with time, the current flowing to the transistor $M_{61}$ side decreases, and the current $I_{REF}$ flowing through the transistor $M_{62}$ complementarily increases. Then, when $V_{CONT}' \gg V_{TH}$, all of the tail current It flows to the transistor $M_{62}$ side, so that $I_{REF}$=It. Therefore, the reference current $I_{REF}$ smoothly increases with time. The first current mirror circuit 112 and the second current mirror circuit 114 loop back the reference current $I_{REF}$ to generate the test current $I_{TEST}$.

When the current source 110 is activated, if the slope of the test current $I_{TEST}$ is steep, a pop noise may occur from the electroacoustic transducer 202 at the time of load determination. Therefore, if no measures are taken, it is necessary to limit the test current $I_{TEST}$ to the order of several tens μA to several hundred μA in order to prevent the pop noise. On the other hand, in the current source 110 of FIG. 10B, since the test current $I_{TEST}$ can be smoothly increased, the occurrence of pop noise can be prevented even when the amount of the test current $I_{TEST}$ is increased. When the test current $I_{TEST}$ can be increased, the detection accuracy in the load state determination circuit 130 can be improved.

(Second Modification)

The audio amplifier 100 having the differential input pins INP and INN has been described in the embodiment. However, the audio amplifier 100 is not limited thereto but may have a single-ended input. In this case, a single-ended input audio signal may be branched into a positive phase signal and a negative phase signal, which are then input to the first amplifier 102P and the second amplifier 102N, respectively.

(Third Modification)

A case of determining the open abnormality by comparing the potential difference ΔV between the MONP pin and the MONN pin with the threshold value $V_{OPEN}$ has been described in the embodiment. However, the operation of the load state determination circuit 130 is not limited thereto. For example, the resistance value $R_L$ of the electroacoustic transducer 202 varies from 4Ω to 32Ω. Therefore, the load state determination circuit 130 may determine the resistance value $R_L$ of the normal electroacoustic transducer 202 based on the potential difference ΔV between the MONP pin and the MONN pin.

(Applications)

Figure 11A:
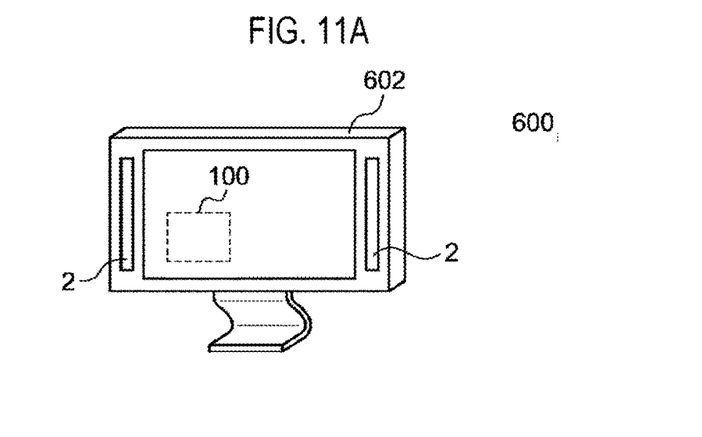
FIG. 11A to FIG. 11C are external views of an electronic apparatus.
Figure 11B:
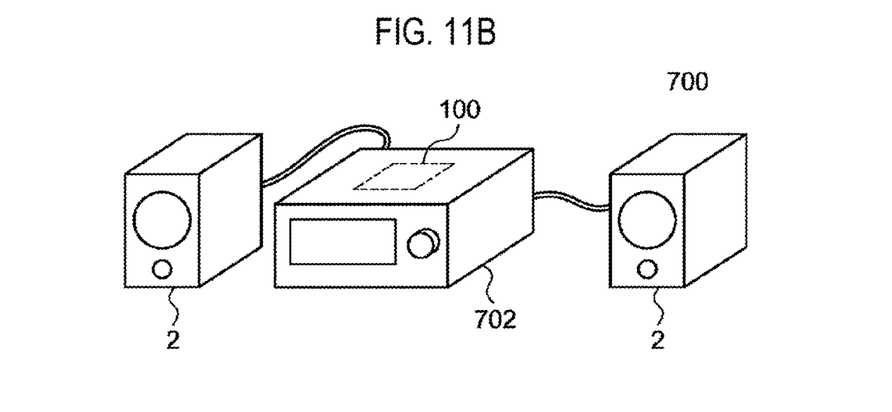
Figure 11C:
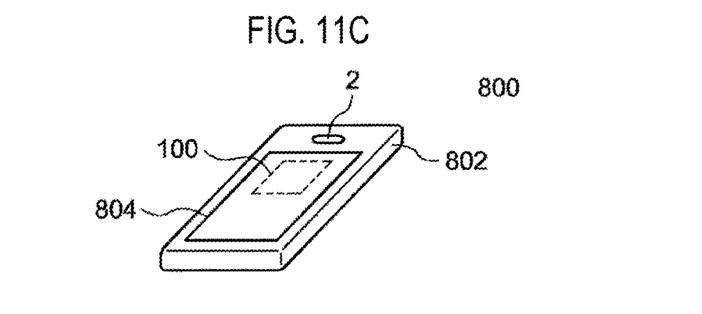

Finally, applications of the audio output device 200 will be described. FIG. 11A to FIG. 11C are external views of an electronic apparatus 1. FIG. 11A shows a display device 600 which is an example of the electronic apparatus 1. The display device 600 includes a housing 602 and a speaker 2. The audio output device 200 is incorporated in the housing 602 and drives the speaker 2. The speaker 2 corresponds to the electroacoustic transducer 202.

FIG. 11B shows an audio component 700 which is an example of the electronic apparatus 1. The audio component 700 includes a housing 702 and a speaker 2. The audio output device 200 is incorporated in the housing 702 and drives the speaker 2.

FIG. 11C shows a compact information terminal 800 which is an example of the electronic apparatus 1. The compact information terminal 800 may be a smartphone, a tablet PC (Personal Computer), an audio player, a digital camera, a digital video camera, or the like. The compact information terminal 800 includes a housing 802, a speaker 2, and a display 804. The audio output device 200 is incorporated in the housing 802 and drives the speaker 2.

According to the present disclosure in some embodiments, it is possible to provide an audio amplifier capable of detecting abnormality in various application circuits and setting criteria on abnormality by means of external parts.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio amplifier of a BTL (Bridged Tied Load) type, comprising:
   a first amplifier;
   a second amplifier;
   a first output pin connected to an output of the first amplifier;
   a second output pin connected to an output of the second amplifier;
   a first monitor pin;
   a second monitor pin;
   a current source connected to the first monitor pin and configured to be switched on and off;
   a switch interposed between the second monitor pin and a fixed voltage line;
   a load state determination circuit configured to detect a state of a load based on a potential difference between the first monitor pin and the second monitor pin;
   an enable pin to which an enable signal for instructing open detection is input; and
   a shutdown pin to which a shutdown signal indicative of a shutdown state or release of the shutdown state is input,
   wherein the current source is turned on when the enable signal instructs the open detection, and
   wherein, when the shutdown signal is indicative of the shutdown state and the enable signal instructs the open detection, the load state determination circuit is enabled.

2. The audio amplifier of claim 1, wherein the load state determination circuit is configured to detect an open state of the load based on a result of comparison between the potential difference and a predetermined threshold voltage.

3. The audio amplifier of claim 2, wherein the load state determination circuit includes a voltage comparator to which a voltage of each of the first monitor pin and the second monitor pin is input, and
   the voltage comparator has an input offset voltage corresponding to the predetermined threshold voltage.

4. The audio amplifier of claim 1, wherein the switch serves as a transistor for surge protection.

5. The audio amplifier of claim 1, further comprising a control pin,
wherein a current generated by the current source is adjusted according to a state of the control pin.

6. The audio amplifier of claim 1, wherein a current generated by the current source smoothly increases with time.

7. The audio amplifier of claim 1, wherein the audio amplifier is integrated on a single semiconductor substrate.

8. An audio output device comprising:
an electroacoustic transducer; and
the audio amplifier of claim 1 that is configured to drive the electroacoustic transducer.

9. An electronic apparatus comprising:
an electroacoustic transducer; and
the audio amplifier of claim 1 that is configured to drive the electroacoustic transducer.

10. An audio amplifier of a BTL (Bridged Tied Load) type, comprising:
a first amplifier;
a second amplifier;
a first output pin connected to an output of the first amplifier;
a second output pin connected to an output of the second amplifier;
a first monitor pin;
a second monitor pin;
a current source connected to the first monitor pin and configured to be switched on and off;
a switch interposed between the second monitor pin and a fixed voltage line;
a load state determination circuit configured to detect a state of a load based on a potential difference between the first monitor pin and the second monitor pin;
an abnormality detection circuit configured to detect an abnormality of the audio amplifier;
a diagnosis pin configured to notify presence or absence of the abnormality to outside the audio amplifier; and
an output part configured to change a state of the diagnosis pin according to outputs of the abnormality detection circuit and the load state determination circuit,
wherein the abnormality detection circuit is invalidated in a state where the load state determination circuit is enabled.

* * * * *